(12) United States Patent
Hurwitz et al.

(10) Patent No.: US 6,280,640 B1
(45) Date of Patent: *Aug. 28, 2001

(54) PROCESS FOR MANUFACTURING A CHIP CARRIER SUBSTRATE

(75) Inventors: Dror Hurwitz, D.N. Gilboa; Boris Yofis, Haifa; Dror Katz, Haifa; Eva Igner, Haifa, all of (IL)

(73) Assignee: Amitec-Advanced Multilayer Interconnect Technologies Ltd., Migdal Haemek (IL)

( * ) Notice: Subject to any disclaimer, the term of this patent is extended or adjusted under 35 U.S.C. 154(b) by 0 days.

This patent is subject to a terminal disclaimer.

(21) Appl. No.: 09/303,422

(22) Filed: May 3, 1999

(30) Foreign Application Priority Data

Jan. 24, 1999 (IL) ........................................................ 128200

(51) Int. Cl.[7] .................................................. H01B 13/00
(52) U.S. Cl. ........................................... 216/15; 438/688
(58) Field of Search .................................. 216/13, 14, 15; 438/688

(56) References Cited

U.S. PATENT DOCUMENTS 4,295,183 * 10/1981 Miersch et al. ........................ 361/403
5,946,600 * 8/1999 Hurwitz et al. ....................... 438/688

* cited by examiner

*Primary Examiner*—Randy Gulakowski
*Assistant Examiner*—Allan Olsen
(74) *Attorney, Agent, or Firm*—Dennison, Scheiner, Schultz & Wakeman

(57) ABSTRACT

A process for manufacturing a chip carrier substrate, the process including the steps of providing a first layer of copper conductor on a substrate, forming a first layer of barrier metal on the first layer of copper conductor, forming a layer of aluminum on the first layer of barrier metal, forming a second barrier metal on the aluminum layer, patterning the top barrier metal in the form of studs, anodizing the aluminum unprotected by the top barrier metal, removing the aluminum oxide and patterning the first copper layer, removing all the exposed barrier metal; surrounding the studs and the copper conductor with a polymeric dielectric; polishing the polymeric dielectric to expose the studs; and forming a second layer of copper conductor on the planar polymeric dielectric.

23 Claims, 8 Drawing Sheets

PROCESS FOR MANUFACTURING A CHIP CARRIER SUBSTRATE

FIELD OF THE INVENTION

The present invention relates to a process for manufacturing a chip carrier substrate having conductors in multiple layers separated by suitable insulating dielectric materials with vias for interconnection between layers, and a chip carrier substrate formed by this process.

BACKGROUND OF THE INVENTION

Multilevel electronic interconnect structures for a variety of applications, particularly for forming chip carrier substrates, are well known in the art. These interconnect structures generally include several layers of conductors arranged in a predefined pattern separated by suitable insulating (dielectric) materials with vias for interconnection between layers. These structures may be used for manufacturing multi- or single chip carrier substrates and microelectronic passive devices (inductors, capacitors or combined circuitry). Many electronic systems in fields such as the military, avionics, automotive, telecommunications, computers and portable electronics utilize components containing such structures.

A number of techniques are known for producing electronic interconnect vias in chip carrier substrates. According to one process, a dielectric material, generally ceramic or silicon coated with silicon dioxide, or a printed wiring board (PWB) is provided as a base. Conductors are formed on the base beneath the dielectric material. A hole is formed in the dielectric material, which is then sputtered, or electroless plated, and pattern plated with a metal, usually copper, to interconnect the lower level of conductors with a formed upper level. The vias formed in this manner are known as unfilled vias, since the metal does not fill the entire hole. Generally, the upper surface of the dielectric material above the unfilled vias is not planar, due to settling of the dielectric material in the vias. The non-planar surface reduces the conductors' density on the upper metal layer, and the unfilled via decreases the via capability to remove heat generated by a chip.

According to another process, a thick photoresist layer is applied on top of a patterned lower conductor level. The photoresist is patterned to define the vias, and metal, such as copper, is plated up. The photoresist is removed, and polymer dielectric material is applied to cover conductors and vias. In the next step, the polymer is polished to expose the top plated via, and upper conductor level is applied. The vias formed in this manner are known as filled vias. While filled vias provide improved overall chip carrier conductor density, and thermal and electrical properties, than unfilled vias, this process is complicated and expensive. This pattern plating process uses a thick layer of photoresist, or an expensive photosensitive dielectric, and usually results in variation in the thickness of the electroplated copper across the substrate. The variation in copper via thickness may cause problems in determining where the polishing process should stop. Stopping polishing too soon may result in vias not exposed, due to their lower thickness, while stopping polishing too late may cause a reduction of the vertical dielectric spacing below its specified limit, causing variation in the designed electrical performance of the chip carrier substrate.

Yet another process is described in U.S. Pat. No. 5,580,825 to Labunov, et al. This process utilizes aluminum for the conductors and vias, and aluminum oxide as the dielectric material. The process includes defining level conductive paths by carrying out a barrier anodization process on the main aluminum layer to form a surface barrier oxide over the level conductive paths, providing an upper aluminum layer over the main aluminum layer, defining interlevel interconnections on the upper aluminum layer, and subjecting the main and upper aluminum layers to porous anodization. A barrier metal layer must be provided beneath the main aluminum layer to aid in anodization of the aluminum layers, which is then completely anodized itself.

This method suffers from a number of disadvantages. Aluminum oxide is characterized as a dielectric with a high dielectric constant and high electrical losses, so it is not suited to modern chip carrier substrates transmitting high speed signals. In addition, aluminum oxide is sensitive to cracking and has high water absorption, which can change its dielectric properties as an insulator. This process is a low yield process due to conflicting requirements of the need to completely oxidize the lower barrier layer, only after all aluminum residues are converted to aluminum oxide.

Still another process is described in Applicant's co-pending Israel Patent Application 120514. In this application, there is provided a process for manufacturing an electronic interconnect structure having aluminum conductors and filled aluminum vias, separated by a non-aluminum oxide (preferably polymeric) dielectric. The process includes the steps of depositing a first layer of aluminum over a barrier metal layer on an adhesion metal layer deposited on a base; depositing an intermediate barrier metal layer over the first layer of aluminum; patterning the intermediate barrier metal layer; depositing a second layer of aluminum over the first layer of aluminum and the remaining barrier metal; depositing an upper layer of barrier metal over the second layer of aluminum; patterning the upper layer of barrier metal; converting those portions of both layers of aluminum which are not covered by barrier metal to a porous aluminum oxide by porous anodization; removing the porous aluminum oxide; removing the exposed barrier metal and adhesion metal layers to leave exposed conductors and filled vias of aluminum; applying a non-aluminum oxide dielectric material on top of the base material and aluminum conductors and vias; and removing the dielectric material to expose a top surface of the filled aluminum vias.

Despite the fact that, in this method, the aluminum oxide is replaced by a polymeric dielectric material, and that there is no need to oxidize the lower barrier metal layer since it is removed after anodization, both of which substantially improve the processing yield relative to that of Labunov, there are still a number of disadvantages with this method. First, aluminum conductors are inferior to copper conductors because of their higher electrical resistivity. Second, aluminum conductors suffer from electro-migration, especially in high current densities, as compared to copper conductors. Third, the aluminum pad on top of the interconnect structure (chip carrier substrate) is not fully compatible with conventional chip assembly processes. Therefore, chip carrier substrates with aluminum pads or conductors require more processing steps, as compared to copper pads and conductors, which makes production more complicated and expensive.

It has now been found that low dielectric constant (k) materials provide better performance than aluminum oxide, that copper forms conductors having better performance that aluminum, and that it is possible to provide, at reasonable cost, planarized filled aluminum vias with substantially perpendicular side walls formed by an overall simple process. This provides an electronic interconnect structure which is relatively straightforward and inexpensive to manufacture, and which has high density interconnectivity and permits a stacked and landless vias configuration, with superior control and uniformity in the vertical dielectric spacing between conductors across the substrate, suitable for very high speed, high frequency chips.

SUMMARY OF THE INVENTION

According to the present invention, there is provided a process for manufacturing a chip carrier substrate, the process including the steps of providing a first layer of copper conductor on a substrate, forming a first layer of barrier metal on the first layer of copper conductor, forming a layer of aluminum on the first layer of barrier metal, forming a second barrier metal on the aluminum layer, patterning the top barrier metal in the form of studs, anodizing the aluminum unprotected by the top barrier metal, removing the aluminum oxide and patterning the first copper layer, removing all the exposed barrier metal; surrounding the studs and the copper conductor with a polymeric dielectric; polishing the polymeric dielectric to expose the studs; and forming a second layer of copper conductor on the planar polymeric dielectric. The first layer of copper conductor can be provided as part of a prepared base, or can be formed as part of the chip carrier substrate manufacturing process.

In particular, there is provided a process for manufacturing a chip carrier substrate, the process including the steps of depositing an adhesion/barrier metal layer over a base; providing a copper layer over the adhesion/barrier metal layer; depositing a barrier metal layer over the copper layer; depositing a first layer of aluminum over the barrier metal layer; depositing a second barrier metal layer over the first layer of aluminum; applying a photoresist layer on top of the second barrier metal layer; exposing and developing the photoresist layer; removing the exposed metal and photoresist layer, leaving portions of the second barrier metal layer over the aluminum layer; converting those portions of the layer of aluminum which are not covered by second barrier metal to a porous aluminum oxide by porous anodization; removing the porous aluminum oxide to produce aluminum studs; patterning the copper conductor layer; removing all the exposed barrier and adhesion/barrier metal layers; covering the patterned copper layer and the aluminum studs with a dielectric polymer having an overall thickness of less than the sum of the thickness of the copper conductor and the aluminum stud; and polishing the protruding polymer and aluminum studs to expose only the top of the aluminum studs thereby creating a surface to substantial planarity.

According to one embodiment of the invention, the method of patterning the copper conductor layer includes covering a selected pattern on the copper conductor layer and the aluminum studs with a layer of photoresist; exposing and developing the photoresist in the pattern of conductors; removing the exposed barrier metal to leave exposed copper; removing the photoresist; etching the exposed copper layer; removing the exposed adhesion/barrier metal layer, barrier metal layer on top of the copper conductors, and second barrier metal layer on top of the aluminum studs.

According to another embodiment of the invention, the method of patterning the copper conductor layer includes covering a selected pattern on the copper conductor layer and the aluminum studs with a layer of photoresist; exposing and developing the photoresist in the pattern of conductors; removing the exposed second barrier metal to leave exposed copper; etching the exposed copper layer; and removing the photoresist, exposed adhesion/barrier metal layer, barrier metal layer on top of the copper conductors, and second barrier metal layer on top of the aluminum studs.

According to yet another embodiment of the invention, the method of patterning the copper conductor layer includes removing the second barrier metal layer on top of the aluminum studs, before the step of removing the porous aluminum oxide described above.

According to a preferred embodiment of the invention, the steps of forming a first barrier metal layer through the step of forming a second copper conductor layer are repeated until the desired number of layers is reached.

There is further provided in accordance with the present invention a chip carrier substrate including at least two layers of copper conductors on a base separated by a polymeric dielectric material, a plurality of aluminum studs interconnecting the layers of conductors, the aluminum studs being surrounded by the polymeric dielectric material, and a layer of barrier metal between each stud and an interconnected conductor, preventing direct contact between the stud and the conductor.

According to a preferred embodiment of the invention, the base is a printed wiring board (PWB) or multi-layer ceramic (MLC) board. According to an alternative embodiment of the invention, the base is a plain base, which can be either conducting or non-conducting, having no selective through-passage of electronic information from one side to the other.

BRIEF DESCRIPTION OF THE DRAWINGS

The present invention will be further understood and appreciated from the following detailed description taken in conjunction with the drawings in which.

DETAILED DESCRIPTION OF THE INVENTION

The present invention relates to a process for manufacturing a chip carrier substrate, and to a chip carrier substrate prepared by the method, having copper conductors in multiple layers separated by suitable insulating polymeric dielectric materials with aluminum studs (filled aluminum vias) for interconnection between layers of copper conductors. A layer of barrier metal is provided above and beneath each aluminum stud, electrically connecting the aluminum stud and the conductor above and beneath it, while preventing direct contact between the aluminum stud and the copper conductor, which could lead to corrosion. It is a particular feature of the invention that the chip carrier substrate includes studs of substantially identical height, so that when forming a planar upper surface, all studs are uniformly exposed, and high uniformity of the vertical spacing between different copper layers is maintained.

The structures of the invention offer very high density interconnectivity, combined with reliable filled stacked and landless vias formed by an anodization process and surrounded by a very low dielectric constant insulator. Yet the structures have high thermal properties and low cost characteristics, and meet the performance requirements of high speed electronic systems. The process of the invention has fewer process steps than conventional techniques, and the steps are simpler and more controllable.

Figure 1:
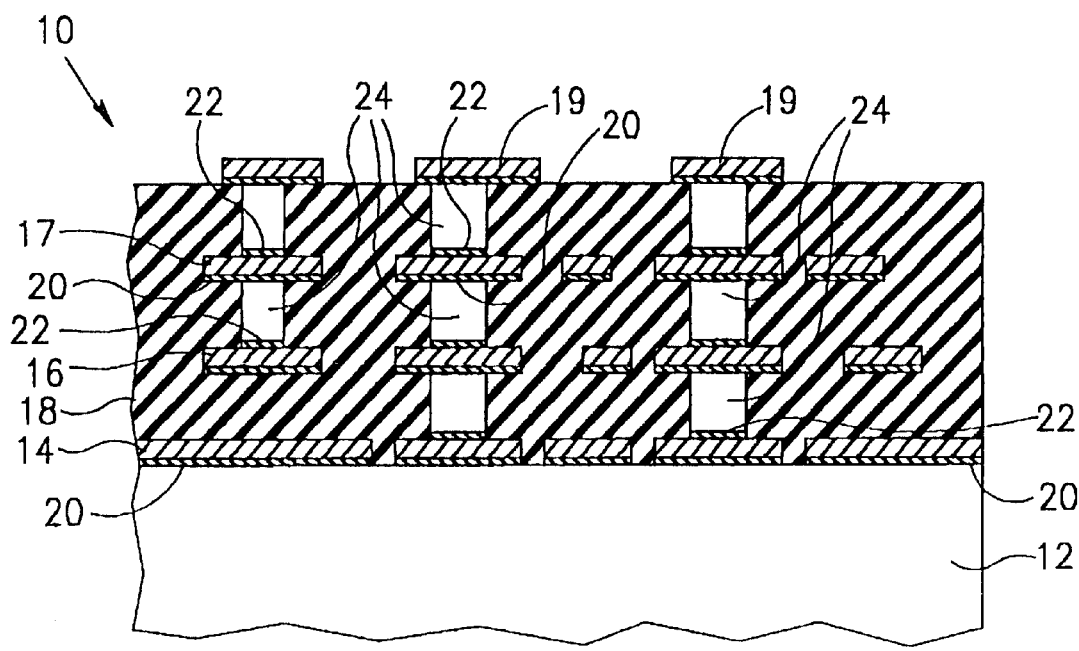
FIG. 1 is a schematic cross-section of a chip carrier substrate constructed and operative in accordance with one embodiment of the present invention.

Referring now to FIG. 1, there is shown a chip carrier substrate 10 constructed and operative in accordance with one embodiment of the present invention. Chip carrier substrate 10 includes a base 12, here illustrated as a plain base through which electronic information cannot selectively pass from one side to the other. The base can be formed of a conducting material, or a non-conducting material appropriate for thin film build-up, i.e., having low surface roughness, and high flatness. Such bases can be formed, for example, of silicon, glass, alumina, aluminum, copper, or any other similar base having no selective through-passage of electronic information from one side to the other. In the embodiment illustrated in FIG. 1, the base is formed of a non-conducting material, such as glass.

At least two layers 14, 16, 17 , 19 of copper conductors, separated by a polymeric dielectric material 18, are formed on base 12. A layer 20 of adhesion metal, which also acts as a barrier metal, preferably titanium or chromium, is provided beneath each conductor 14, 16, 17, 19. The adhesion/barrier metal layer serves to improve the adhesion between the copper conductor and the base or dielectric polymer, while not interfering with the conductivity of the vias and conductors. It also avoids direct contact between copper conductor and aluminum stud underneath.

A layer of a barrier metal 22 is provided on each conductor 14, 16, 17. For purposes of the present application, a barrier metal is any selectively etchable metal, which can be etched without affecting aluminum or copper (as by $CF_4$ plasma etching), including but not limited to, tantalum, tungsten, and titanium, and most preferably is tantalum.

Studs 24 (filled aluminum vias) interconnect conductor layers 14, 16, 17 and 19. It is a particular feature of the invention that, while the conductors are formed of copper, the studs are formed of aluminum, and have a high aspect ratio, and high thickness uniformity. It is a further feature that the via size and shape are limited only by standard thin photoresist resolution and simple anodization process control. As can be seen in FIG. 1, chip carrier substrate 10 has an almost completely planar upper surface, with studs of substantially straight side walls and identical height, uniformly exposed on the top surface. A plurality of chips can be mounted on the surface of the chip carrier copper pad by using nickel/gold metalization over the copper pad, as known.

The basic steps of the method are as follows, as illustrated in FIGS. 2a to 2f. An adhesion/barrier metal layer 32, preferably titanium or chromium, is deposited over a non-conductive base 30. A first copper layer 34, which can be between about 2–4 micron meters thick, is provided on the adhesion/barrier metal layer 32, generally by evaporation or sputtering, or by evaporation or sputtering of a thin film (about 2000Å) of copper seed layer, followed by electroplating. A barrier metal layer 36, most preferably tantalum or titanium, or a combination of both, is deposited over copper layer 34. (FIG. 2a) The thickness of barrier metal layer 36 ranges from about 800Å to 1000 Å.

Figure 2A:
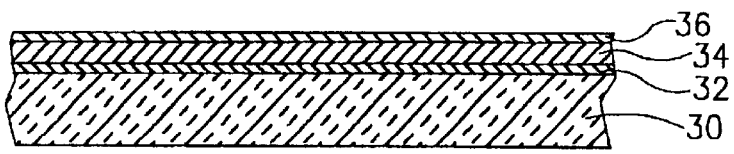
FIGS. 2a to 2f illustrate the first steps in the process of forming a chip carrier substrate in accordance with one embodiment of the present invention.
Figure 2B:
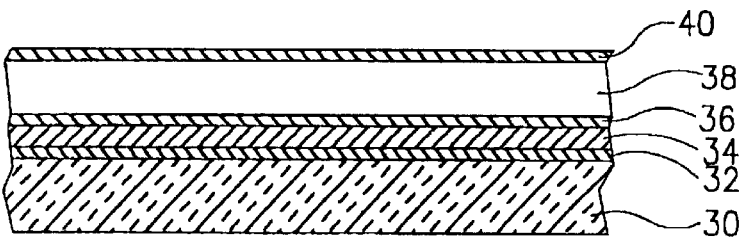

A thick layer (about 5 to 20 micron meters) of aluminum 38 is deposited, generally by evaporation, over the barrier metal layer 36. (FIG. 2b.) A second barrier metal layer 40 (most preferably 1000Å of tantalum) is deposited over the layer of aluminum 38.

Figure 2C:
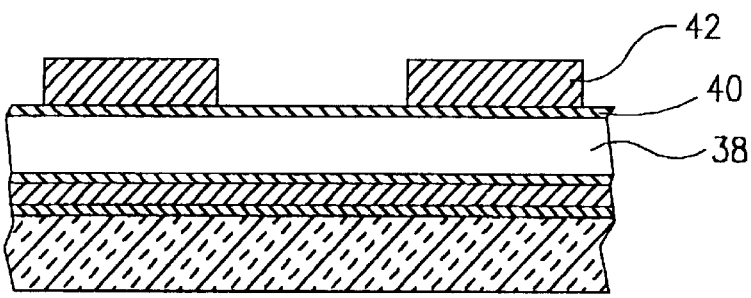
Figure 2D:
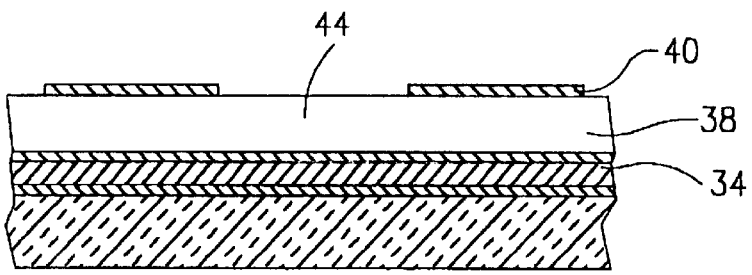
Figure 2E:
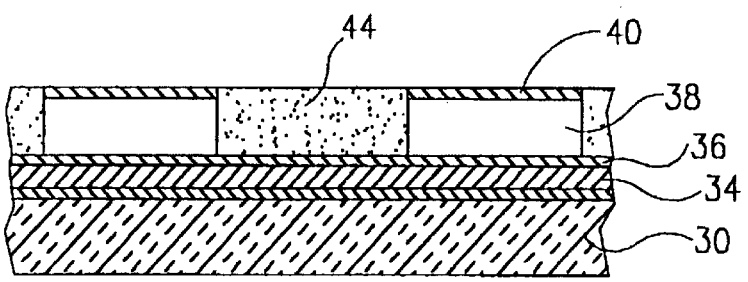
Figure 2F:
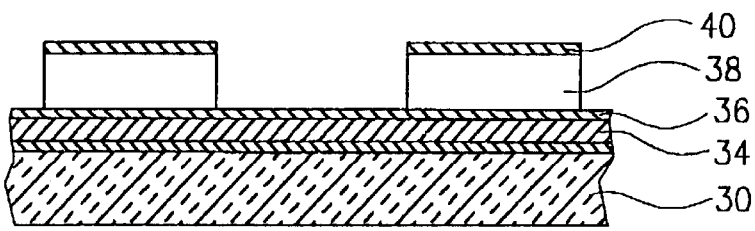

In FIG. 2c, a photoresist layer 42, is coated on top of the second barrier metal layer 40. The photoresist layer 42 is exposed in the form of vias and developed. In FIG. 2d, the exposed barrier metal and photoresist layer are removed, leaving a layer of barrier metal 40 over the aluminum layer in the locations of the vias. Those portions 44 of the layer of aluminum which are not covered by barrier metal are converted to a porous aluminum oxide by porous anodization (FIG. 2e). During anodal polarization, the barrier metal forms a defensive film of oxide with a high resistance to oxidation. It is a particular feature of the invention that the upper layer of barrier metal provides protection against anodization to the aluminum underneath it during manufacturing of the via studs of the chip carrier substrate.

The preferred porous anodization process parameters are given in the following Table 1.

TABLE 1

Porous Anodization Parameters

Solution: Oxalic Acid dehydrate - 30–60 gr/lit.
D.I. Water.
Cathode - SS 316
Anode - Fixtured substrate
Working parameters:

| | Range |
|---|---|
| Temperature | 22° C.–60° C. |
| Voltage | 35–60V |
| Current density (start point) | 0.8–1.6 mA/cm2 |

The anodization process starts by increasing the voltage supply from O to the preset value (between about 35 and 60 V) with constant gradient of 1 to 2 V/sec. Once the preset voltage has been reached, the chosen voltage is kept constant and the current decreases throughout the process. In this way, the top barrier layer will create filled vias by protecting the aluminum layer underneath it, and the bottom barrier layer will prevent direct contact between the formed aluminum stud and the copper underneath it.

When the anodization reaches the bottom barrier layer, the current will drop sharply. At this residual current, the process should be continued for additional 10% to 20% of the total process time length. The reason for keeping the anodization at residual current for that amount of time is to create almost straight side walls of the filled vias. This increases the interconnect density because padless via structures can be created. Also, due to the high resolution characteristics of the anodization process, vias with diameter smaller than 10 micron meters can be created.

After completion of the anodization and when the required aspect ratio has been achieved, the porous aluminum oxide film 44 and exposed barrier layer 36 on the conductors are removed completely. Preferably this is carried out using the solution and parameters set forth in Table 2. It is a particular feature of this solution that it does not etch aluminum, thereby leaving the vias unetched. Proper agitation might be required in order to remove oxide residues.

Table 2: Aluminium Oxide Etch Process

Solution: Chromium oxide $CrO_3$ anhydrous—20 gr/lit

Phosphoric Acid: $H_3PO_4$ conc.(85%)—35 ml/lit

D.I. Water

Temperature—75° C.–85° C.

Figure 3A:
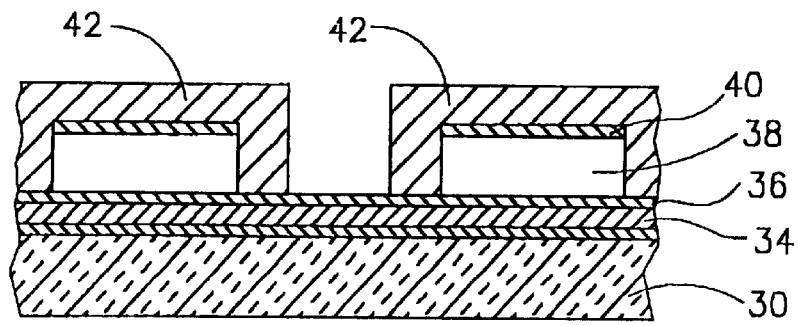
FIGS. 3a to 3c illustrate the steps of patterning the conductors in one process of forming a chip carrier substrate according to the invention.
Figure 3B:
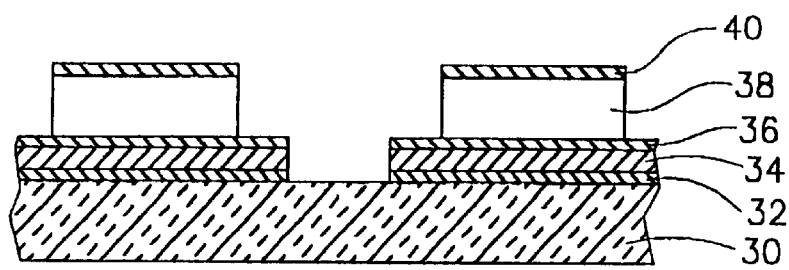
Figure 3C:
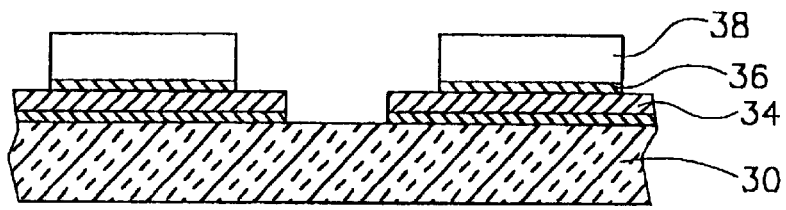

The conductor layer is now patterned and formed. According to one embodiment of the invention, illustrated in FIGS. 3a to 3c, the process includes the following steps. In FIG. 3a, a thick layer of photoresist 42 covers the barrier metal and studs. The photoresist is exposed and developed in the form of the conductors. Now the exposed barrier metal layer 36 is selectively etched. The photoresist is removed, and the copper is wet etched, preferably by a solution which does not etch aluminum (FIG. 3b). Most preferably, a so-called "piranha" solution, including 2% $H_2O_2$, 5% $H_2SO_4$, and DI Water, at a temperature range of 30° C. to 60° C. is used. Finally, the exposed barrier metal in layers 36 and 40 and the adhesion/barrier metal layer 32 are selectively removed, as by plasma. (FIG. 3c)

Figure 4A:
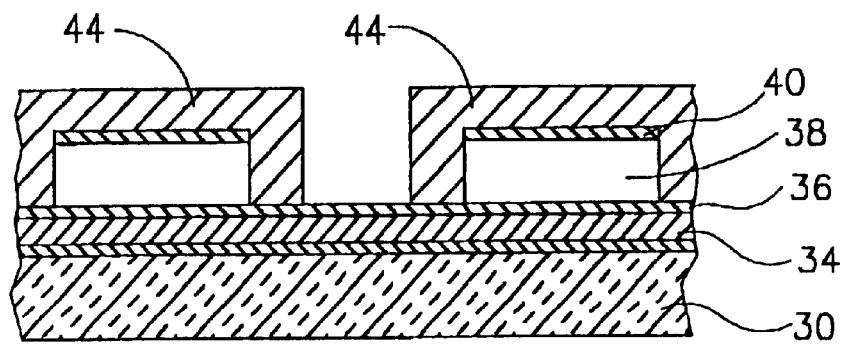
FIGS. 4a to 4c illustrate the steps of patterning the conductors in an alternate process of forming a chip carrier substrate according to the invention.
Figure 4B:
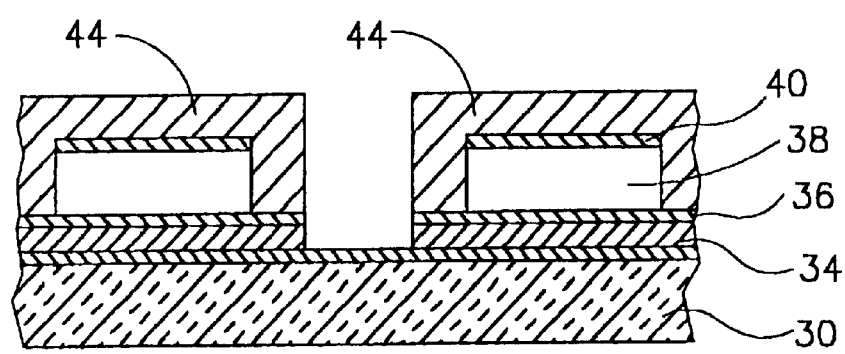
Figure 4C:
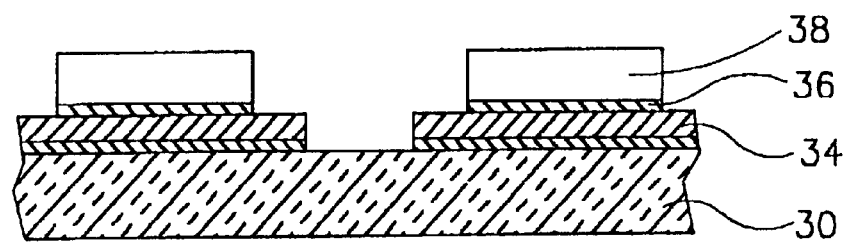

According to another embodiment of the invention, illustrated in FIGS. 4a to 4c, the conductor layer is formed as follows. In FIG. 4a, a thick layer of photoresist 42 covers the barrier metal and studs. The photoresist is exposed and developed to pattern the conductors, but not removed. Now the exposed barrier metal layer 36 is selectively etched, and the copper layer 34 is wet etched (FIG. 4b). One example of a suitable copper etching solution includes 15% $(NH_4)_2S_2O_8$, 5% $H_2SO_4$, and 0.1% $CuSO_4$, and etching is carried out at a temperature between about 35° and 60° C.

Finally, the photoresist 42, the exposed barrier metal 40 on the studs, the exposed barrier metal 36 on the conductors, and the adhesion/barrier metal layer 32, are selectively removed (FIG. 4c), as by plasma etching.

Figure 5A:
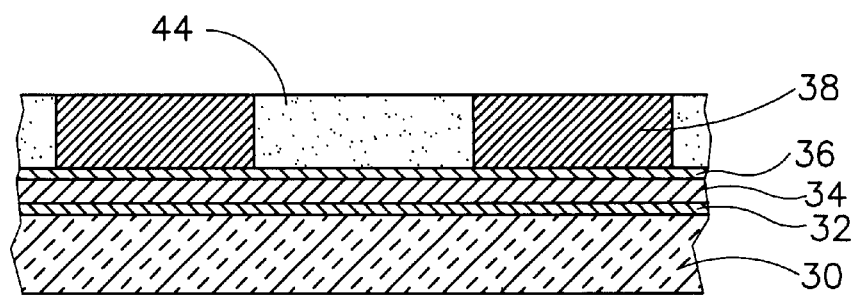
FIGS. 5a to 5c illustrate the steps of patterning the conductors in an alternate process of forming a chip carrier substrate according to the invention.
Figure 5B:
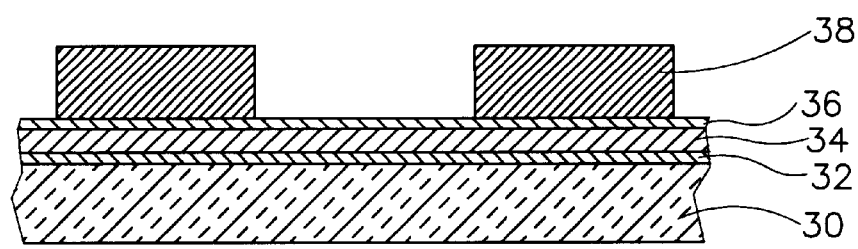
Figure 5C:
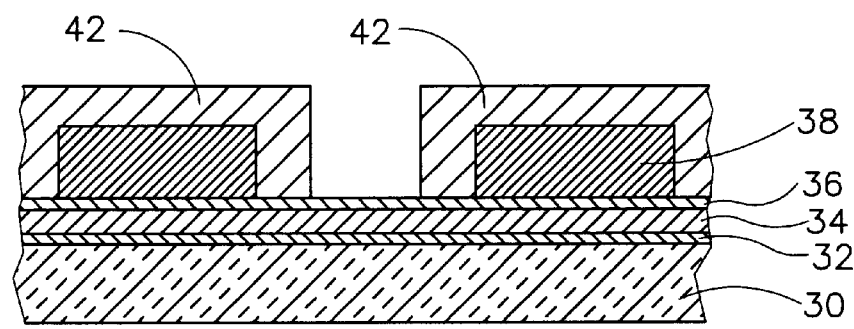

According to yet another embodiment of the invention, illustrated in FIGS. 5a to 5c, after porous anodization, the second barrier metal layer 40 over the aluminum studs is removed by plasma etching (FIG. 5a), and the porous aluminum oxide 44 is removed (FIG. 5b). The substrate is now covered with a thick layer of photoresist 42 (FIG. 5c), and the process continues either as in FIGS. 3a to 3c, or as in FIGS. 4a to 4c, with the exception that the barrier metal layer 40 over the aluminum studs need not be removed at a later stage, thus avoiding coverage problems of photoresist on top of the aluminum studs.

It is a particular feature of the invention that the height of the studs is very uniform, generally no more than about 3% variation. In addition, the height of the posts is relatively high, on the order of 10 to 20 micron meters, enabling high dielectric vertical spacing between copper conductors, to decrease electrical signal losses in very high frequency applications.

A polymeric dielectric material 46 is applied to the patterned chip carrier substrate about the studs and patterned copper. The preferred polymeric dielectric materials are those having a very low dielectric constant, i.e., less than about 3.0, including benzocyclobutane (BCB) (such as the Cyclotene™ series, manufactured by Dow Chemicals), polyimides (such as the Pyralin® series manufactured by DuPont Electronic Materials, USA) and Parylene, manufactured by Alfa Metals, USA. BCB and Polyimide preferably are spin coated on the patterned chip carrier substrate, while Parylene is preferably applied by chemical vapor deposition (CVD).

Figure 6A:
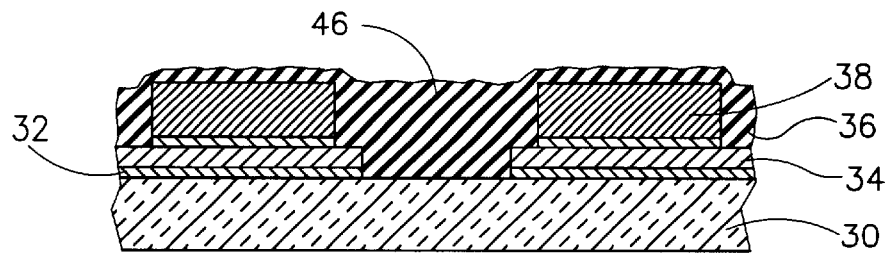
FIGS. 6a and 6b illustrate the final steps in one embodiment of the process of forming a chip carrier substrate according to the invention.

In the present invention, the polymeric dielectric material is applied to cover the etched copper layer and the aluminum studs, such that the overall thickness of the dielectric material is less than the sum of the thickness of the copper conductor and the aluminum stud. Thus, the tops of the studs, covered with dielectric, protrude from the rest of the polymeric dielectric surface (FIG. 6a). In this way, when the chip carrier substrate is subjected to the next process of Chemical Mechanical Polishing (CMP), the removal rate of the protruding aluminum stud and the polymer on it is significantly higher than the removal rate of the plain polymer on the rest of the surface. This is due to the fact that the protruding polymer and stud are subjected to scraping (side polishing), as well as to much higher pressure than the plain field.

The CMP process is a global planarization method using special tooling, polishing pads, and slurries to planarize the surface, as known in the art. It is a particular feature of the present invention that the slurries used have a very low polymer removal rate when acting on plain polymer surface, and a very high removal rate when acting on bumps created by the protruding studs and polymer. Thus, once the protruding studs are removed, the removal rate by polishing is significantly reduced, thereby creating an "auto stop" polishing effect. By using the above described method, the importance of stud thickness uniformity prior to CMP becomes clear: combining high uniformity polymer coating methods (as spin coat or CVD) with stud thickness uniformity prior to CMP, the "auto stop" polishing effect can achieve highly uniform vertical dielectric spacing.

The polishing slurry includes an abrasive material, preferably 0–30% $SiO_2$ with particle size of less than 2000Å. Preferably, two additives are included in the polishing slurry. One additive is a surfactant, which decreases the surface scratches on the soft polymer surface caused by the hard abrasive element in the slurry. Triton X-100, such as manufactured by Riedel-De Haen GmbH, Germany, in the range of 0.1% to 5%, is the preferred choice. The second additive is an acid material, which acts as an aluminum micro-etcher for smoothing the exposed surfaces of the studs. $H_3PO_4$, in the range of 0.1% to 5%, is the preferred choice.

Figure 6B:
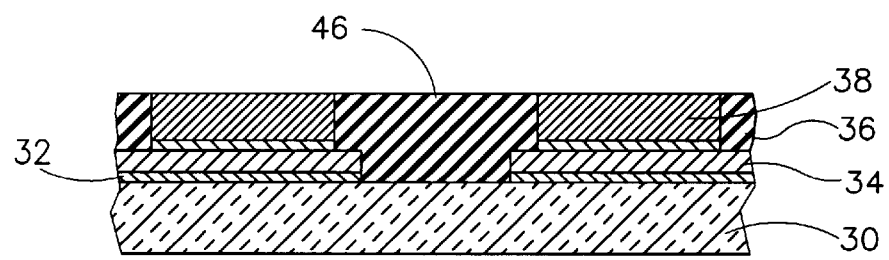
Figure 8:
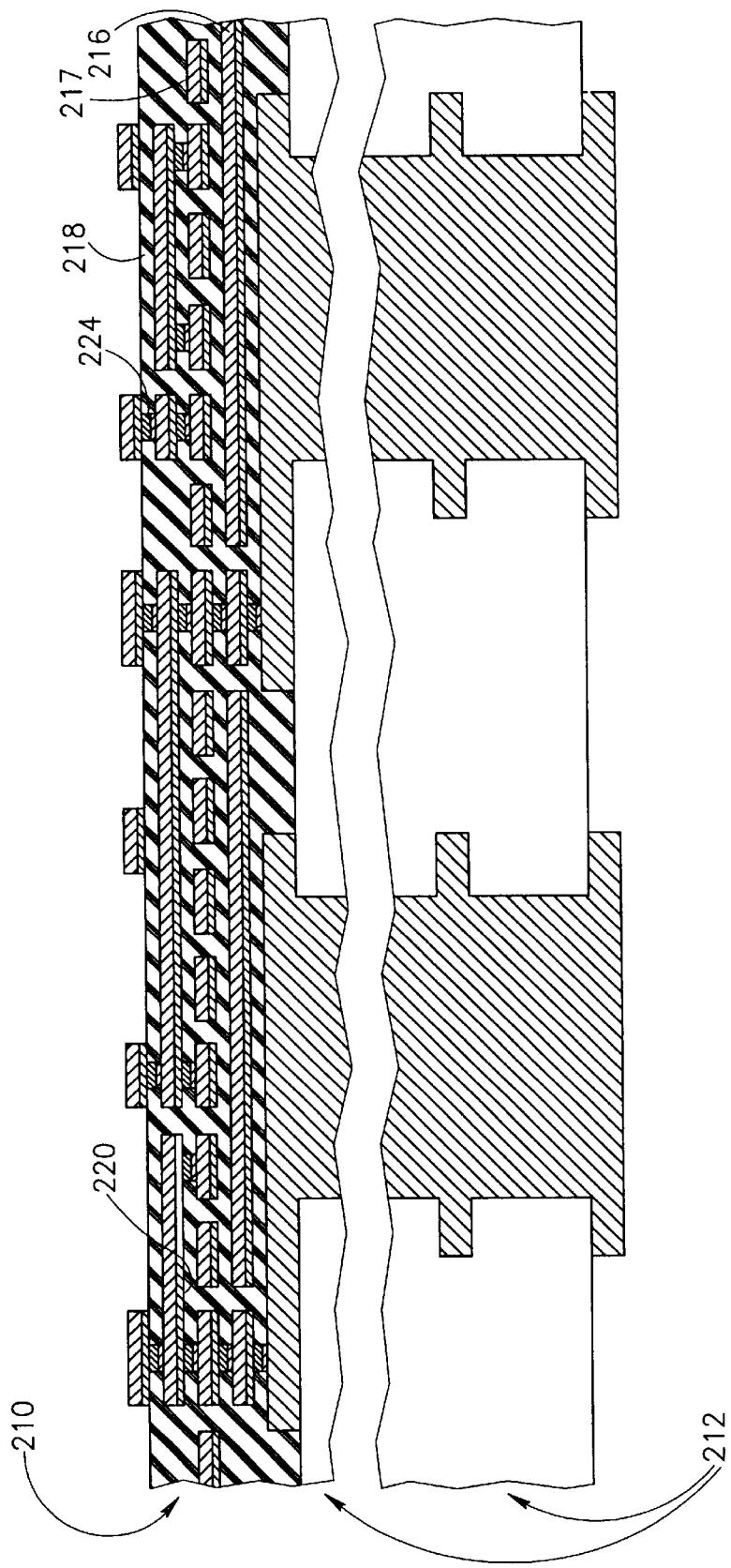
FIG. 8 is a schematic cross-section of a chip carrier substrate having selective electrical contacts from one side to its other side, constructed and operative in accordance with one embodiment of the present invention.

Once the structure shown in FIG. 6b is achieved, the steps described in FIGS. 2a to 6b are repeated until the required number of layers in the structure are achieved. Typically, up to four conductor layers are provided, where the uppermost (external) copper layer (with no aluminum studs on top) can be patterned by etching (using photoresist as an etch resist), or by electroplating (through a patterned photoresist), and treated with Ni/Au, as known in the art. It will be appreciated that the external conductor layer alternatively may be formed as a single copper layer, provided that the other metal conductor layer is part of a Printed Wiring Board (PWB) base or a Multi-Layer Ceramic (MLC) base, as shown in FIG. 8. In this case, the porous anodization step is performed on a single layer of patterned aluminum to create studs that will electrically interconnect the PWB or MLC upper copper layer to the created single copper layer.

It will be appreciated that deposition of each of the electric conductive materials described, such as titanium, tantalum, copper, and aluminum, can be performed by any conventional vacuum deposition technique, such as E-Gun evaporation or sputtering. Alternatively, copper can be electroplated over an evaporated or sputtered copper seed layer.

Figure 7:
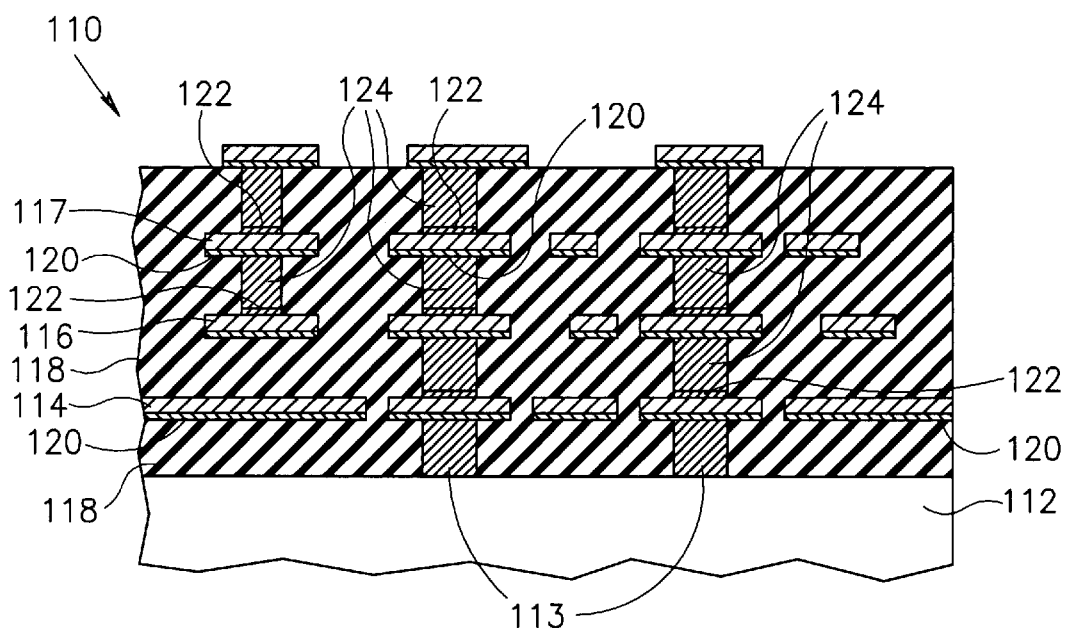
FIG. 7 is a schematic cross-section of a chip carrier substrate constructed and operative in accordance with another embodiment of the present invention.

Referring now to FIG. 7, there is shown a schematic cross-section of a chip carrier substrate 110 constructed and operative in accordance with another embodiment of the present invention. Chip carrier substrate 110 is substantially similar to chip carrier substrate 10 of FIG. 1, except that it includes a base 112 formed of aluminum. In this case, base 112 acts as a base layer of conducting material onto which the chip carrier substrate is built, and the first processing step is preparation of the base for thin film build-up of the chip carrier substrate, by preparing a first layer of studs 113.

In the process of forming this chip carrier substrate, a barrier metal layer is deposited over the aluminum base 112. The barrier metal is patterned using photoresist, and after removal of the photoresist, the exposed aluminum surface is anodized to a specified depth, thereby creating aluminum studs. Then, the aluminum oxide and the barrier metal are removed, and polymer dielectric is applied. After polishing, during which the tops of the aluminum studs are exposed, the process begins as described above (from FIG. 2a) with regard to formation of the chip carrier substrate of FIG. 1.

Figure 9:
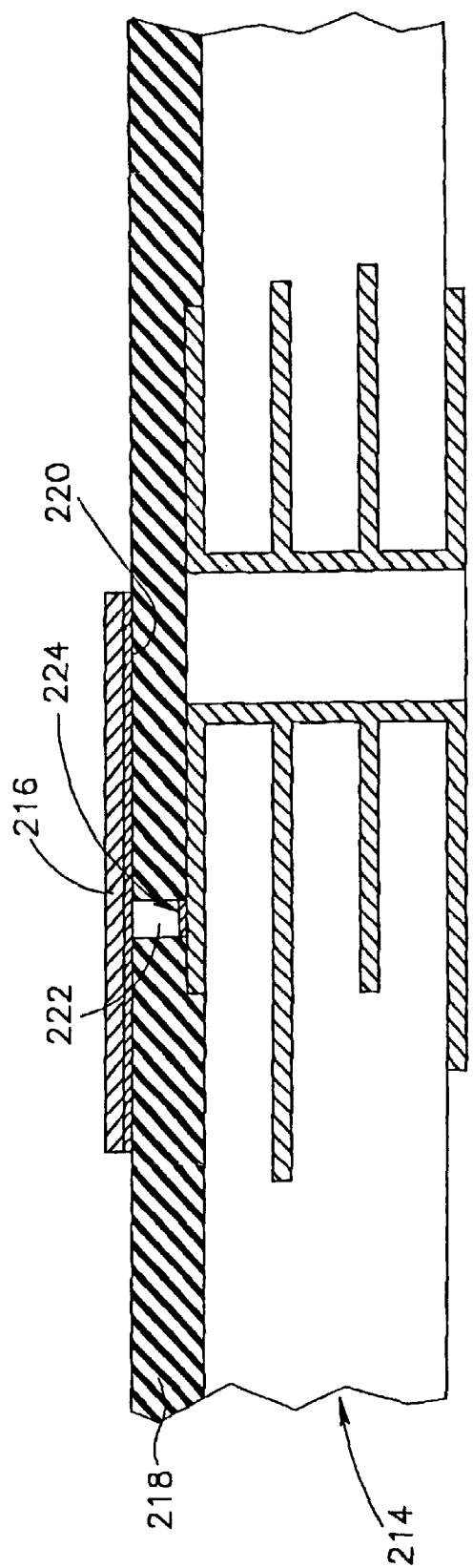
FIG. 9 is a schematic cross-section of a chip carrier substrate constructed and operative in accordance with an alternative embodiment of the present invention.

FIGS. 8 and 9 are schematic cross-sectional illustrations of a chip carrier substrate 210 constructed and operative in accordance with a preferred embodiment of the present invention. Chip carrier substrate 210 is substantially similar to chip carrier substrate 110 of FIG. 7, except that it includes a printed wiring board (PWB) 212, 214, having a non-externally patterned copper layer as its upper surface, as its base. This base can be a multi-layer conventional PWB, including layers of conductors surrounded by polymeric dielectric material, as known. The PWB is manufactured, using conventional manufacturing techniques, to the stage of external layer processing —including mechanical hole drilling, plated copper through-holes, and plugging of the plated through-holes, either by conductive material (as shown in FIG. 8) or by non-conductive material (as shown in FIG. 9). At this stage, the board has two external copper layers, electrically connected through copper plated holes, suitable for preparation as a base for a chip carrier substrate. It will be appreciated that the chip carrier substrate of the present invention is capable of redistributing the dense I/O's of a chip onto a much less dense PWB or MLC board.

The non-externally patterned copper layer of base 212, 214 acts as a base copper conductor layer onto which the chip carrier substrate is built. It will be appreciated that chip carrier substrate 210 can be coupled on one side to a PWB (mother board) by solder Ball Grid Array (BGA) technology, and that its other, built-up side, is arranged to connect chips or passive components. Briefly, a barrier layer 224 is formed on the copper layer of the PWB. A thick layer of aluminum 222 is formed on the barrier layer 224, followed by an upper layer of barrier metal. Photoresist is applied, developed, the barrier is selectively patterned, as by plasma etching, and the photoresist is removed. The exposed aluminum is oxidized and removed, leaving studs 222 on the barrier layer 224 on the non-patterned copper of the PWB. Now, the barrier layer is patterned, and the exposed copper layer of the PWB is etched. The exposed top and bottom barrier layers are removed, and the copper/aluminum structures are filled with dielectric, to a level below the tops of the aluminum studs, with dielectric covering the protruding studs. The protruding dielectric and aluminum studs are polished to expose only the tops of the aluminum studs 222, as described above. In the next step, an adhesion/barrier metal layer 220 followed by a copper external layer 216 are deposited. These layers are patterned by etching (with photoresist as etch resist), or by electroplating (with photoresist as plating resist), if there is no need for additional copper layers. If additional copper layers are required, the process may continue as in FIGS. 2b to 4c.

Alternatively, base 212 can be a multi-layer ceramic (MLC) board, having a non-externally patterned copper layer in its upper surface.

The process of the present invention has several advantages relative to conventional interconnect structure manufacturing techniques. The present structure provides filled aluminum studs with small diameter, and height up to 20 micron meters, with the superior conducting capability and reliability of copper conductors.

The filled via structure has a significant enhancement for dissipating the heat generated by the chip, and also for its power distribution system. The power paths associated with stacked studs (enabled by filled vias) are less inductive, and therefore are able to support increased switching activities. Also the voltage drop for each stud is reduced, providing better electrical interconnection to a chip. The use of low dielectric constant polymeric material substantially increases the speed of electrical signal transfer through the chip carrier substrate. High vertical dielectric spacing (up to 20 micron meters) decreases signal losses at a specified impedance, and the highly uniform vertical dielectric spacing enables better control when trying to meet designed electrical characteristics. Also, the planarized surface of the structure increases the yield of the next lithographic step and chip assembly processes. Finally, the structure is characterized by its high density studs (vias) and conductor structure, manufactured by a relatively simple, and high yield process.

It will be appreciated that the invention is not limited to what has been described hereinabove merely by way of example. Rather, the invention is limited solely by the claims which follow.

What is claimed is:

1. A process for manufacturing a chip carrier substrate, the process comprising the steps of:

a) providing at least first and second layers of copper conductors on a base;

b) electrically connecting said layers of copper conductors by aluminum studs formed by anodization;

c) providing an electrically connecting layer of barrier metal between each aluminum stud and interconnected conductors, before said step of electrically connecting; and d) surrounding said studs and at least said first layer of copper conductor with a polymeric dielectric.

2. A process for manufacturing a chip carrier substrate, the process comprising the steps of:

a) providing a first layer of copper conductor on a substrate;

b) forming a first layer of barrier metal on said first layer of copper conductor;

c) forming a layer of aluminum on the first barrier metal layer;

d) providing a barrier metal mask in the form of studs on the aluminum layer;

e) anodizing the aluminum unprotected by the barrier metal mask;

f) removing the aluminum oxide;

g) etching the first layer of copper conductor;

h) surrounding said studs and said etched copper conductor with a polymeric dielectric;

i) polishing said polymeric dielectric to expose tops of said studs;

j) forming an adhesion/barrier metal layer on said polished polymeric dielectric and exposed stops of studs;

k) forming a second layer of copper on said adhesion/barrier metal layer.

3. The process according to claim 2, wherein said step of polishing includes:

a) providing a polymeric dielectric having a low dielectric constant over the studs and the copper conductors, the thickness of the dielectric being less than the combined thickness of the copper conductor and aluminum studs; and b) polishing said polymeric dielectric until a planarized, smooth surface including exposed tops of the aluminum studs and polished polymer surface is created.

4. The process for manufacturing a chip carrier substrate according to claim 2, comprising the steps of:

a) depositing a barrier metal layer over a copper layer;

b) depositing a first layer of aluminum over the barrier metal layer;

c) depositing a second barrier metal layer over the first layer of aluminum;

d) applying a photoresist layer on top of the second barrier metal layer;

e) exposing and developing the photoresist layer;

f) removing the exposed barrier metal and photoresist layer, leaving a layer of second barrier metal over the aluminum layer;

g) converting those portions of the layer of aluminum which are not covered by second barrier metal to a porous aluminum oxide by porous anodization;

h) removing said porous aluminum oxide;

i) patterning said first barrier metal layer;

j) etching said copper conductor layer;

k) removing said first and second barrier metal layers;

l) covering the etched copper layer and aluminum studs with a dielectric polymer whose thickness is less than the combined thickness of the copper layer and aluminum studs;

m) polishing said polymeric dielectric until a planarized, smooth surface including exposed tops of the aluminum studs and polished polymer surface is created;

n) forming an adhesion/barrier metal layer on said polished polymer surface and exposed tops of the aluminum studs; and o) forming a second layer of copper on said adhesion/barrier metal layer.

5. The process according to claim 4, further comprising, before said step a) depositing a barrier metal layer, the steps of:

a) depositing an adhesion/barrier metal layer over a base; and b) providing a copper layer over the adhesion/barrier metal layer.

6. The method of claim 2, wherein the steps b) to j) repeated until the desired number of layers is reached.

7. The process according to claim 4, wherein said step of patterning said copper conductor layer includes:

a) removing said porous aluminum oxide, to produce aluminum studs;

b) covering a selected pattern on the first barrier metal layer and the aluminum studs with a layer of photoresist;

c) exposing and developing the photoresist in the pattern of conductors;

d) removing the exposed barrier metal to leave exposed copper;

e) removing said photoresist;

f) etching the exposed copper layer with a solution which does not etch aluminum and barrier metal; and g) removing the barrier metal layer on top of the copper conductors, and second barrier metal layer on top of the aluminum studs.

8. The process according to claim 4, wherein said step of patterning said copper conductor layer includes:

a) removing said porous aluminum oxide, to produce aluminum studs;

b) covering a selected pattern on the copper conductor layer and the aluminum studs with a layer of photoresist;

c) exposing and developing the photoresist in the pattern of conductors;

d) removing the exposed second barrier metal to leave exposed copper;

e) etching the exposed copper layer; and f) removing the photoresist, exposed barrier metal layer on top of the copper conductors, and second barrier metal layer on top of the aluminum studs.

9. The process according to claim 7, further comprising the step of removing the second barrier metal layer on top of the aluminum studs, before the step of removing the porous aluminum oxide.

10. The process according to claim 8, further comprising the step of removing the second barrier metal layer on top of the aluminum studs, before the step of removing the porous aluminum oxide.

11. The process according to claim 3, wherein said step of polishing is carried out using a slurry having a very low polymer dielectric removal rate over a plain, non-bumpy polymer surface.

12. The process according to claim 3, wherein said step of polishing is carried out using a slurry including abrasive material, surfactant to decrease polymer scratches, and acid to smooth said tops of said aluminum studs.

13. The process according to claim 11, wherein said slurry includes:

an abrasive material including 0–30% $SiO_2$ with particle size of less than 1000Å;

a surfactant including Triton X-100, in the range of 0.1% to 5%; and an acid including $H_3PO_4$ in the range of 0.1% to 5%.

14. The process according to claim 12, wherein said slurry includes:

an abrasive material including 0–30% $SiO_2$ with particle size of less than 1000Å;

a surfactant including Triton X-100, in the range of 0.1% to 5%; and an acid including $H_3PO_4$ in the range of 0.1% to 5%.

15. The process according to claim 2, wherein said second copper conductor layer is an external copper layer with no aluminum studs thereon, and said step of forming said second copper layer includes:

providing a copper seed layer on said adhesion/barrier metal layer;

covering said seed layer with a photoresist;

plating up said copper layer;

removing said photoresist;

etching said copper seed layer; and removing exposed said adhesion/barrier metal layer.

16. The method according to claim 1, wherein said dielectric material has a dielectric constant of less than about 3.0.

17. The method according to claim 2, wherein said dielectric material has a dielectric constant of less than about 3.0.

18. The method according to claim 2, wherein said dielectric material includes a polyimide.

19. The method according to claim 2, wherein said dielectric material includes a benzocyclobutane.

20. The method according to claim 2, wherein said dielectric material includes Parylene.

21. The method according to claim 1, wherein said base is a printed wiring board (PWB) or Multi-Layer Ceramic (MLC) board, and one of said layers of copper conductor is a pre-formed part of said board.

22. The method according to claim 1, wherein said base is a plain conducting base having no selective through-passage of electronic information from one side to the other.

23. The method according to claim 1, wherein said base is a plain non-conducting base having no selective through-passage of electronic information from one side to the other.

* * * * *